United States Patent [19]
Eitoku et al.

[11] Patent Number: 5,943,726
[45] Date of Patent: Aug. 31, 1999

[54] SUBSTRATE PROCESSING APPARATUS

[75] Inventors: Atsuro Eitoku; Takao Kunihiro, both of Shiga-ken, Japan

[73] Assignee: Dainippon Screen Mfg. Co., Ltd., Japan

[21] Appl. No.: 08/957,353

[22] Filed: Oct. 24, 1997

[30]     Foreign Application Priority Data

Oct. 28, 1996  [JP]  Japan .................................. 8-285375

[51] Int. Cl.⁶ .................................................. A46B 13/02
[52] U.S. Cl. ........................... 15/77; 15/88.2; 15/88.3; 15/102
[58] Field of Search ....................... 15/77, 88.2, 88.3, 15/102, 21.1, 97.1, 88.1

[56]         References Cited

U.S. PATENT DOCUMENTS

| | | | |
|---|---|---|---|
| 4,993,097 | 2/1991 | D'Amato | 15/77 |
| 5,475,889 | 12/1995 | Thrasher et al. | 15/77 |
| 5,675,856 | 10/1997 | Itzkowitz | 15/77 |
| 5,685,039 | 11/1997 | Homada et al. | 15/88.2 |
| 5,860,178 | 1/1999 | Nishimura et al. | 15/77 |
| 5,860,181 | 1/1999 | Maekawa et al. | 15/77 |

FOREIGN PATENT DOCUMENTS 96 9897  8/1996  Japan .

*Primary Examiner*—Gary K. Graham
*Attorney, Agent, or Firm*—Ostrolenk, Faber, Gerb & Soffen, LLP

[57]         ABSTRACT

A substrate processing apparatus adapted to properly perform a substrate scrubbing process with the use of a scrubbing member. The apparatus includes a retention member for retaining a scrubbing member for scrubbing a substrate and a vertical drive mechanism for vertically moving the retention member. The state of the scrubbing member and the vertical position of the retention member are sensed, and a vertical position of the retention member suitable for the scrubbing of the substrate is determined on the basis of the results of the sensing. Then, the retention member is moved to the position thus determined.

6 Claims, 5 Drawing Sheets

F I G. 2
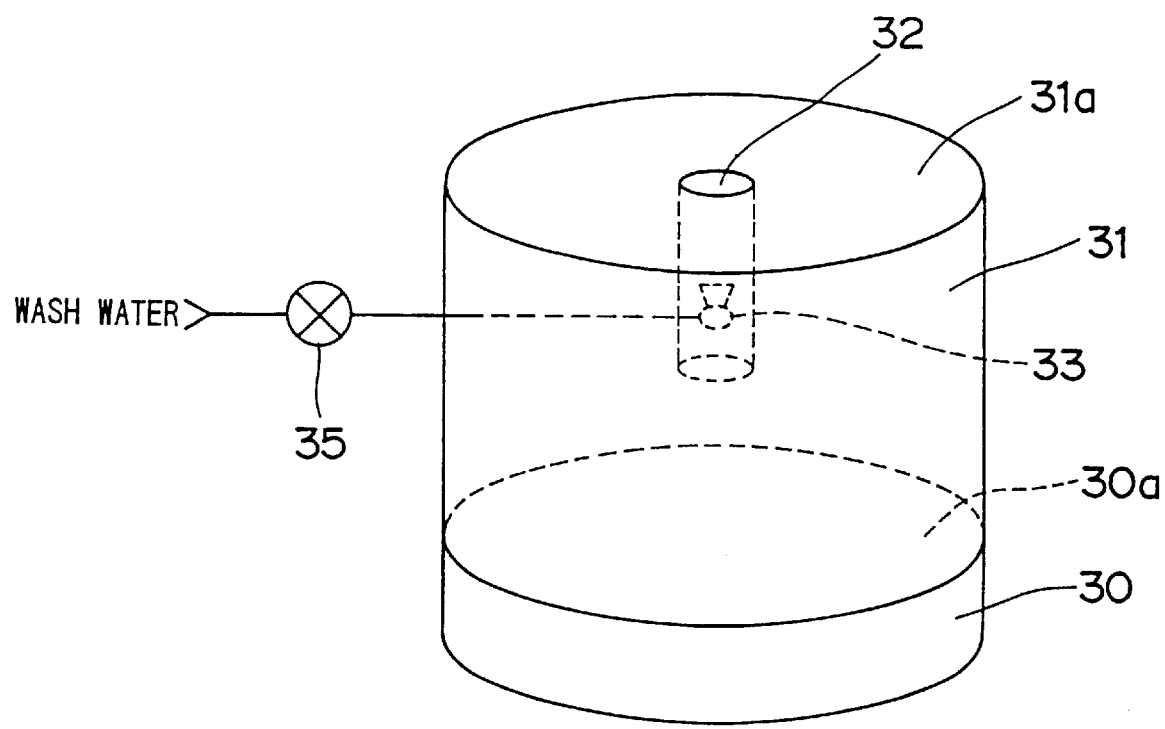

SUBSTRATE PROCESSING APPARATUS

BACKGROUND OF THE INVENTION

1. Field of the Invention

The present invention relates to a substrate processing apparatus for processing any of various kinds of substrates such as semiconductor wafers, glass substrates for liquid crystal displays, and substrates for PDPs (plasma display panels).

2. Description of Related Art

A semiconductor device fabrication process typically includes the step of repeatedly subjecting a semiconductor wafer (hereinafter referred to simply as "wafer") to film formation and etching processes to form fine patterns on a surface of the wafer. Since the surface of the wafer and the surface of a thin film formed thereon should be kept clean for fine processing thereof, the wafer is subjected to a cleaning process as required. For example, after a wafer or a thin film formed on the surface thereof is polished with the use of a slurry or abrasive, the slurry remains on the wafer surface; therefore, it is necessary to clean the wafer for removal of the slurry.

The wafer cleaning process for the removal of a slurry remaining on a wafer surface conventionally employs a disk brushing device, the construction of which is schematically illustrated in FIG. 5. A cleaning brush 1 is disposed above a wafer W held on a spin chuck (not shown). The cleaning brush 1 is attached to a distal end of a pivot arm 3 with its face downward, the pivot arm 3 being pivotal about a pivot shaft 4. The cleaning brush 1 can be rotated and revolved by pivoting the pivot arm 3. Further, the pivot shaft 4 is movable vertically, so that the cleaning brush 1 can be moved up and down between a processing position where the brush 1 abuts against the wafer W and a stand-by position where the brush 1 is retracted to the upper side of the wafer W.

To perform the cleaning process, the spin chuck is rotated at a high speed, thereby rotating the wafer W about a vertical center axis thereof. The cleaning brush 1, while being rotated about its axis, is scanned on the surface of the wafer W radially outwardly from the center thereof. Thus, the entire surface of the wafer W is subjected to a scrubbing process, and contaminants removed through the scrubbing process are forced out of the wafer W. The cleaning of the wafer W is achieved in this manner.

To ensure a constant cleaning effect, the cleaning brush 1 should be pressed against the surface of the wafer W with a proper pressure. Conventionally, the pivot shaft 4 is vertically moved by means of a pulse motor, and the directing pulse number for the drive of the pulse motor is adjusted by an operator so that the depression of the cleaning brush 1 with respect to the wafer W can properly be adjusted through visual observation.

However, the adjustment based on the visual observation by an operator inevitably entails errors, because the judgment criteria vary due to differences in the physical sensitivity among individual operators on different occasions. Further, precise adjustment cannot be ensured on the basis of the visual observation. It is therefore impossible to constantly provide for the maximum cleaning effect. In addition, the adjustment is performed less frequently because the operation of the apparatus should be temporarily stopped for the adjustment. It is therefore difficult to properly perform the adjustment operation in accordance with the wear or deformation of the cleaning brush. Further, the adjustment through the visual observation is troublesome.

SUMMARY OF THE INVENTION

It is an object of the present invention to provide a substrate processing apparatus and a substrate processing method which can properly perform a substrate scrubbing operation by means of a scrubbing member.

The substrate processing apparatus of the present invention comprises a substrate holding mechanism for generally horizontally holding a substrate, a scrubbing member for scrubbing the substrate held by the substrate holding mechanism, a retention member for retaining the scrubbing member, a vertical drive mechanism for vertically moving the retention member, a state sensing device for sensing a state of the scrubbing member, and a position sensing device for sensing a vertical position of the retention member. A vertical position of the retention member for the scrubbing of the substrate is determined on the basis of the state sensed by the state sensing device and the position sensed by the sensing device, and the retention member is moved to that vertical position.

Thus, the substrate scrubbing position of the retention member is automatically determined in accordance with the state of the scrubbing member. Therefore, a troublesome adjustment operation by an operator can be dispensed with, and variations in the adjustment operation can be eliminated which may result from differences among individual operators on different occasions. Thus, the substrate scrubbing process can properly be performed. Since the vertical position of the retention member is automatically controlled, the adjustment operation can frequently be performed in accordance with the state of the scrubbing member. Thus, the scrubbing process can properly be performed regardless of the deformation or wear of the scrubbing member.

In accordance with one embodiment of the present invention, the state sensing device includes a pressure sensing device for sensing an pushing pressure of the scrubbing member, and the vertical position of the retention member is controlled so that the pushing pressure of the scrubbing member equals a predetermined reference pressure.

With this arrangement, the scrubbing member is pressed against the pressure sensing device so that an pushing pressure sensed at this time equals the reference pressure. Since the vertical position of the retention member for the scrubbing process can be determined so that the pushing pressure applied to the substrate by the scrubbing member equals the reference pressure, the scrubbing process can be performed with application of a proper pressure.

The substrate processing apparatus preferably further includes a cleaning liquid supplying device for supplying a cleaning Liquid to the scrubbing member when the scrubbing member is located adjacent to the pressure sensing device.

With this arrangement, the scrubbing member can be cleaned, for example, in parallel with the sensing of the pushing pressure of the scrubbing member. Thus, the cleaning of the scrubbing member can be carried out without any loss time to prevent the substrate from being re-contaminated with contaminants adhering to the scrubbing member.

The substrate scrubbing method of the present invention includes the steps of: sensing a state of a scrubbing member for scrubbing a substrate; sensing a vertical position of the scrubbing member when the state of the scrubbing member is sensed in the state sensing step; moving the scrubbing member toward a substrate horizontally held by a substrate holding mechanism; and vertically moving the scrubbing member on the basis of the vertical position sensed in the position sensing step to press the scrubbing member against the substrate for scrubbing of the substrate.

In accordance with one embodiment of the method of the present invention, the state sensing step includes the steps of: sensing a pressure with which the scrubbing member for scrubbing the substrate is pressed against a sensing face of a pressure sensing device; and adjusting an pushing pressure of the scrubbing member by vertically moving the scrubbing member so that the pressure sensed in the pressure sensing step equals a predetermined reference pressure. The position sensing step includes a balance position sensing step of sensing a vertical position of the scrubbing member when the pressure sensed in the pressure sensing step equals the predetermined reference pressure in the pressure adjusting step.

The method preferably further includes the step of supplying a cleaning liquid to the scrubbing member when the scrubbing member is located adjacent to the pressure sensing device.

The foregoing and other objects, features and effects of the present invention will become more apparent from the following description of the preferred embodiments with reference to the attached drawings.

BRIEF DESCRIPTION OF THE DRAWINGS

FIG. 2 is a schematic diagram illustrating an arrangement for cleaning a disk brush;

DESCRIPTION OF THE PREFERRED EMBODIMENTS

Figure 1:
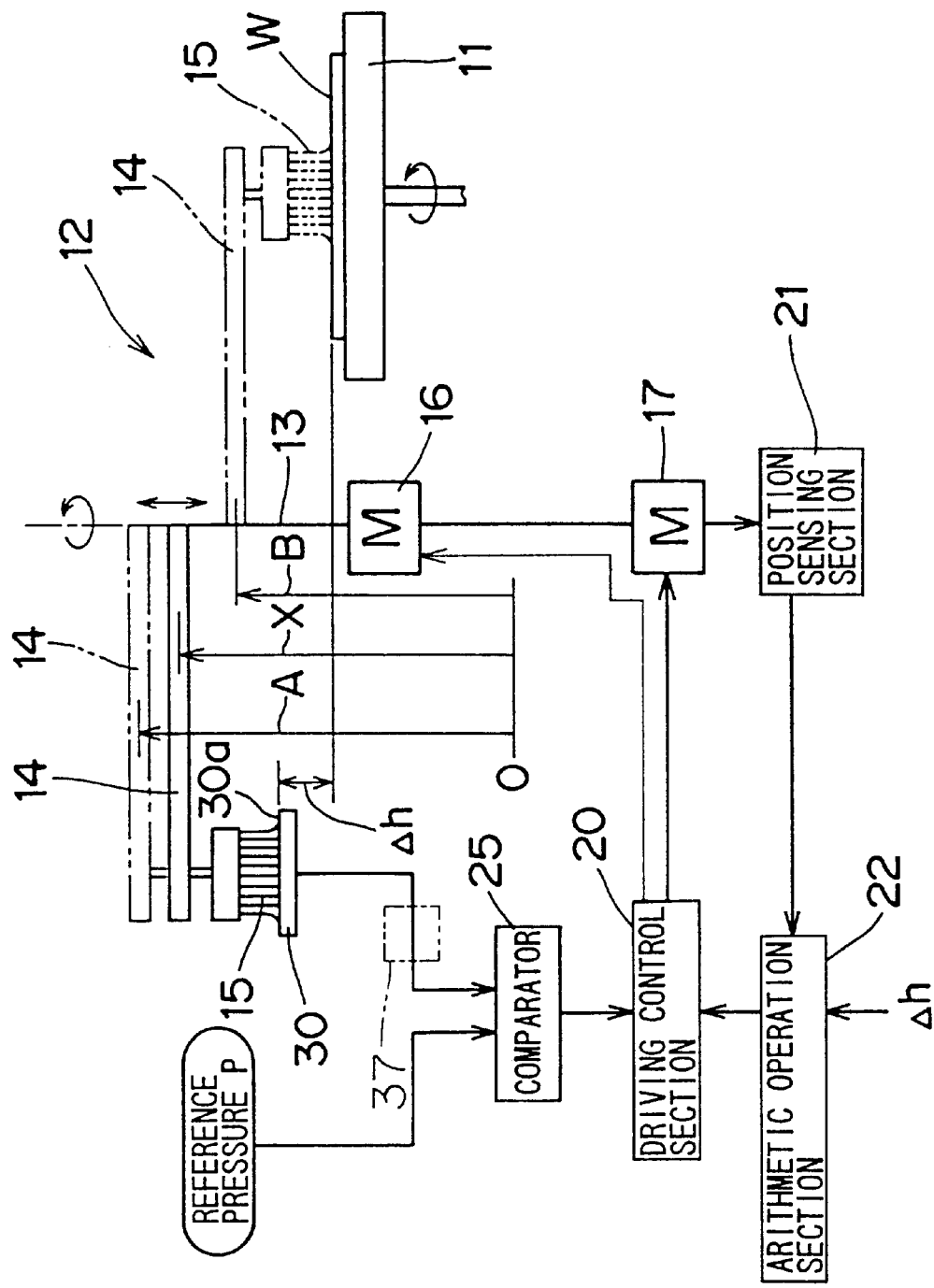
FIG. 1 is a diagram schematically illustrating the basic construction of a wafer cleaning apparatus according to a first embodiment of the present invention.

FIG. 1 is a diagram schematically illustrating the basic construction of a wafer cleaning apparatus which is a substrate processing apparatus according to a first embodiment of the present invention. The apparatus has a spin chuck 11 (substrate holding mechanism) for holding a wafer W thereon and a disk brush device 12 for scrub-cleaning a surface of the wafer W held on the spin chuck 11. The spin chuck 11 is adapted to hold the wafer W generally horizontally and rotate the wafer W about a vertical center axis thereof.

The disk brush device 12 has a pivot shaft 13 extending along the vertical direction, a pivot arm 14 (retention member) pivotal about the pivot shaft 13, a disk brush 15 (scrubbing member) attached to the pivot arm 14 with its face downward, a rotation motor (not shown) for rotating the disk brush 15, a pivot motor 16 for pivoting the pivot arm 14, and an elevation motor 17 (vertical drive mechanism) for moving up and down the pivot shaft 13.

By vertically moving the pivot shaft 13 by means of the elevation motor 17, the vertical position of the pivot arm 14 can be controlled so that the pivot arm 14 is located either in a processing position where the disk brush 15 abuts against the surface of the wafer W with a proper pressure or in a stand-by position (higher than the processing position) where the disk brush 15 is kept away from the wafer W. In the following explanation, the heights of the stand-by position and the processing position with respect to a predetermined reference position 0 are represented by A and B, respectively.

The pivot motor 16 and the elevation motor 17 are each comprised of a pulse motor, for example, the operation of which is controlled on the basis of a control signal applied from a driving control section 20 (retention member vertical drive control section). Thus, the angular position of the pivot arm 14 and the vertical position of the pivot shaft 13 (i.e., the vertical position of the pivot arm 14) are controlled.

A pressure sensor 30 (pressure sensing device) is disposed in a position where a wafer W held on the spin chuck 11 is not located and the disk brush 15 can be placed thereon when the pivot arm 14 does not face toward the wafer W. The pressure sensor 30 has a pressure sensing face 30a which faces upward and is horizontally disposed at a height differing by $\Delta h$ from the top surface of the wafer W held by the spin chuck 11. If the pressure sensing face 30a is located in the same horizontal plane as the wafer W, $\Delta h$ is zero.

An output of the pressure sensor 30 is inputted to a comparator 25, and compared with a predetermined reference pressure P. The result of the comparison is inputted to the driving control section 20.

To sense the vertical position of the pivot arm 14, a position sensing section 21 (position sensing device) having an encoder and the like is provided in association with the elevation motor 17. The position sensing section 21 outputs positional information indicative of the vertical position of the pivot arm 14. The positional information which indicates, for examples, a height with respect to the reference position O is applied to an arithmetic operation section 22. The arithmetic operation section 22 performs a calculation by subtracting $\Delta h$ from the height of the pivot arm 14 sensed by the position sensing section 21, and inputs the calculation result to the driving control section 20.

The driving control section 20 controls the pivot motor 16 to pivot the pivot arm 14 to move the disk brush 15 to the upper side of the pressure sensor 30, when the scrub cleaning of a wafer W is not performed. At this time, the pivot arm 14 is located in the stand-by position at a height A. Further, the driving control section 20 controls the elevation motor 17 to lower the pivot arm 14. In the course of the lowering of the pivot arm 14, the driving control section 20 monitors the output of the comparator 25. As the pivot arm 14 is lowered, the disk brush 15 is brought into contact with the pressure sensing face 30a of the pressure sensor 30, and further pressed against the pressure sensing face 30a while being deformed. Thus, a pressure applied onto the pressure sensing face 30a increases and finally reaches the reference pressure P. In other words, the elevation motor 17 is controlled so that the pressure sensed on the pressure sensing face 30a equals the reference pressure P.

When an output indicating that the pressure applied on the pressure sensing face 30a has reached the reference pressure P is applied from the comparator 25, the driving control section 20 takes in an output of the arithmetic operation section 22. Where the height of the pivot arm 14 with respect to the reference position O sensed when the pressure sensed by the pressure sensor 30 equals the reference pressure P is represented by X, the output of the arithmetic operation section 22 is represented by X–$\Delta h$.

The driving control section 20 employs X–$\Delta h$ as the height B of the processing position. When a wafer W held on the spin chuck 11 is to be subjected to the scrubbing process, the driving control section 20 controls the elevation motor 17 to move the pivot arm 14 to the height B determined in the aforesaid manner. Therefore, a pressure applied onto the wafer W by the disk brush 15 at this time equals the reference pressure P. Further, the depression of the disk brush 15 pressed against the wafer W equals the depression of the disk brush 15 pressed against the pressure sensing face 30a when the reference pressure P is sensed by the pressure sensor 30.

In this embodiment, the depression of the disk brush 15 pressed against the wafer W is precisely determined on the basis of the predetermined reference pressure P so that the disk brush 15 is pressed against the wafer W with the reference pressure P. Unlike the prior art employing the adjustment method through visual observation, this embodiment can properly determine the depression of the cleaning brush without any variation in the judgment criteria due to differences among individual operators on different occasions, thereby ensuring proper cleaning of the wafer W. In addition, the adjustment is automated, so that no troublesome adjustment operation is required. Since the height B of the processing position can be adjusted at any time when the scrubbing process is not performed, the processing height adjustment step may be incorporated, for example, in the wafer cleaning process. More specifically, the processing height adjustment step can be performed during a period between the end of a wafer scrubbing process and the start of the next wafer scrubbing process. Thus, the optimum processing height is automatically adjusted in accordance with the deformation or aging degree of the disk brush 15. Even if the disk brush 15 is wore or deformed, a satisfactory cleaning effect is therefore ensured.

For more precise adjustment of the depression of the disk brush 15, an average pushing pressure may be obtained by rotating the disk brush 15 on the pressure sensing face 30a during the pushing pressure sensing by means of the pressure sensor 30 and averaging outputs of the pressure sensor 30 obtained within a predetermined period by means of an averaging circuit 37 (indicated by an alternate two dot and dash line in FIG. 1), and then compared with the reference pressure P. Thus, even if the disk brush 15 has a deformed portion in contact with wafer W, the depression of the disk brush 15 can properly be adjusted.

Further, as shown in FIG. 2, a cylindrical pressure transfer member 31 may be disposed on the pressure sensing face 30a of the pressure sensor 30. The pressure transfer member 31 has a recess 32 formed in an upper central portion thereof. A nozzle 33 (cleaning liquid supplying device) for ejecting wash water upward is provided in the recess 32. In this case, a top surface 31a of the pressure transfer member 31 serves as the pressure sensing face. A water feed valve 35 for controlling the wash water feed to the wash water ejection nozzle 33 is opened when the disk brush 15 is located adjacent to the top surface of the pressure transfer member 31. Thus, the cleaning of the disk brush 15 can be performed simultaneously with the adjustment of the height B of the processing position, and the wafer W is prevented from being re-contaminated with contaminants adhering to the disk brush 15 without waste of time. The water feed valve 35 is preferably opened when the disk brush 15 abuts against the top face 31a of the pressure transfer member 31 (i.e., during a pressure sensing period). Thus, scattering of the wash water toward outside of the apparatus can be suppressed.

Instead of employing the nozzle 33 in recess 32, a lateral nozzle for supplying wash water laterally to the disk brush 15 may be provided so that the disk brush 15 is cleaned with wash water supplied through the lateral nozzle.

Figure 3:
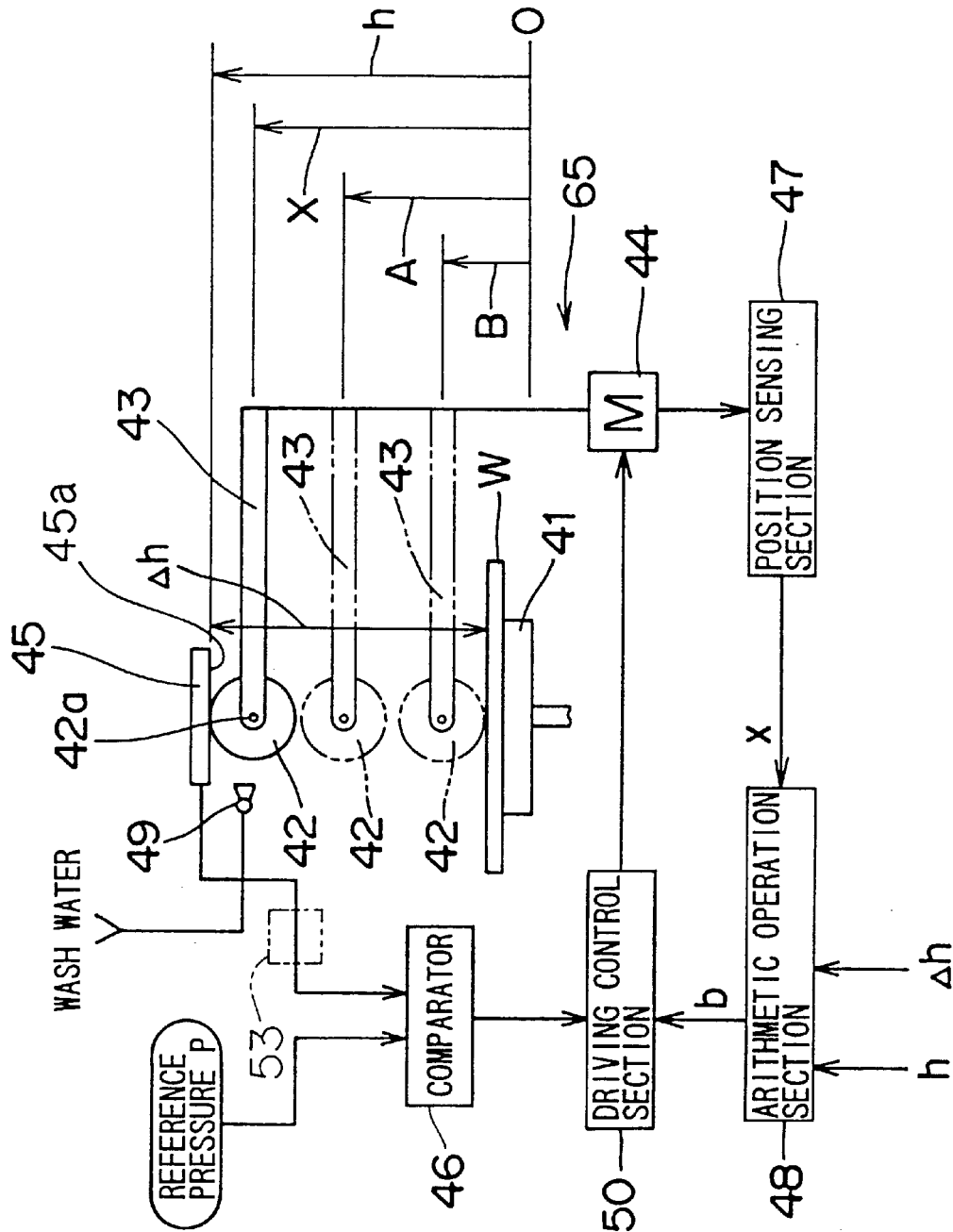
FIG. 3 is a diagram illustrating the basic construction of a wafer cleaning apparatus according to a second embodiment of the present invention.

FIG. 3 is a diagram illustrating the basic construction of a wafer cleaning apparatus according to a second embodiment of the present invention. The wafer cleaning apparatus is adapted to clean a wafer W horizontally held by a chuck 41 with a roll brush 42 (scrubbing member). The roll brush 42 is horizontally disposed in a parallel relation to a top surface of the wafer W held by the chuck 41. The chuck 41 is moved relative to the roll brush 42 in a horizontal direction perpendicular to the shaft 42a (described below)of the roll brush 42. The cleaning of the wafer W is thus achieved by scanning the roll brush 42 on the wafer W.

The roll brush 42 is rotated about its shaft 42a by a motor for the roll brush 42 (not shown). The shaft 42a of the roll brush 42 is supported by a support member 43 (retention member). The support member 43 is moved up and down by means of an elevation mechanism 65 having an elevation motor 44. Thus, the support member 43 is movable between a processing position where the roll brush 42 abuts against a wafer W held by the chuck 41 and a stand-by position where the roll brush 42 is kept away from the wafer W. In the following explanation, the heights of the processing position and the stand-by position with respect to a predetermined reference position O are represented by B and A, respectively.

A pressure sensor 45 is disposed above the roll brush 42. The pressure sensor 45 has a pressure sensing face 45a which faces downward and is horizontally disposed. The pressure sensing face 45a is located at a height differing by Δh from the top surface of a wafer W held by the chuck 41.

A pressure sensed by the pressure sensor 45 is inputted to a comparator 46 and compared with a predetermined reference pressure P, and the comparison result is inputted to a driving control section 50. The driving control section 50 serves to control the elevation motor 44.

A position sensing section 47 for outputting position data indicative of the height of the support member 43 with respect to the reference position O is disposed in association with the elevation motor 44. An output of the position sensing section 47 is inputted to an arithmetic operation section 48. The arithmetic operation section 48 calculates a value b from the following equation on the basis of the height h of the pressure sensing face 45a with respect to the reference position O, the height difference Δh and the height x of the support member 43 sensed by the position sensing section 47. And the arithmetic operation section 48 inputs the value b to the driving control section 50.

$$b=2h-\Delta h-x$$

The driving control section 50 controls the elevation motor 44 to move up the support member 43 from the stand-by position when a wafer W is not subjected to the scrubbing process by the roll brush 42. Thus, the roll brush 42 abuts against the pressure sensing face 45a of the pressure sensor 45. By further applying an upward driving force to the support member 43, the pressure sensed by the pressure sensor 45 reaches the reference pressure P. In other words, the elevation motor 44 is controlled so that the sensed pressure equals the reference pressure P.

Upon sensing on the basis of the output of the comparator 46 that the pressure sensed by the pressure sensor 45 has reached the reference pressure P, the driving control section 50 employs the output of the arithmetic operation section 18 obtained at this time as a new height B of the support member 43 in the processing position. More specifically, the height B of the support member 43 in the processing position is obtained from the following equation (1):

$$B = 2h - \Delta h - X \tag{1}$$

wherein X is the height of the support member 43 sensed when the pressure sensed by the pressure sensor 45 reaches the reference pressure P.

Therefore, the driving control section 50 adjusts the vertical position of the support member 43 to the thus determined height B in the scrubbing process. As a result, the roll brush 42 is pressed against the top surface of the wafer W with the reference pressure P in the scrubbing process.

The validity of the equation (1) can be proved in the following manner.

It is apparent from FIG. 3 that the following equation is true, wherein "r" indicates the radius of the roll bush 42.

$$\Delta h = r + (X - B) + r$$
$$= (h - X) + (X - B) + (h - X) \quad \because r = k - X$$
$$= 2h - X - B$$

The equation (1) can be obtained by solving this equation for B. Since h and Δh are known, the height B of the support member 43 in the suitable processing position is determined on the basis of the height X sensed by the position sensing section 44.

If it is assumed that the reference position O is located on the top surface of a wafer W held by the chuck 41, h=Δh. Therefore, in this case, the height B is obtained from the following equation.

$$B = \Delta h - X$$

In this embodiment, the roll brush 42 can assuredly be pressed against the top surface of the wafer W with the reference pressure P by positioning the support member 43 at the height B thus determined. Thus, the same effects as in the first embodiment can be ensured.

An average pushing pressure may be obtained by rotating the roll brush 42 about the shaft 42a during the pressure sensing by means of the pressure sensor 45 and averaging outputs of the pressure sensor 45 obtained within a predetermined period by means of an averaging circuit 53 (indicated by an alternate two dot and dash line in FIG. 3), and then compared with the reference pressure P. As a result, even if the roll brush 42 has a locally varied diameter, the height B of the support member 43 in the processing position can properly be determined.

A cleaning nozzle 49 may be provided adjacent to the pressure sensor 45 for jetting wash water toward the roll brush 42 when no wafer W is held on the chuck 41. Thus, the roll brush 42 can be cleaned so as to be prevented from being re-contaminated with contaminants adhering to the roll brush 42.

Figure 4:
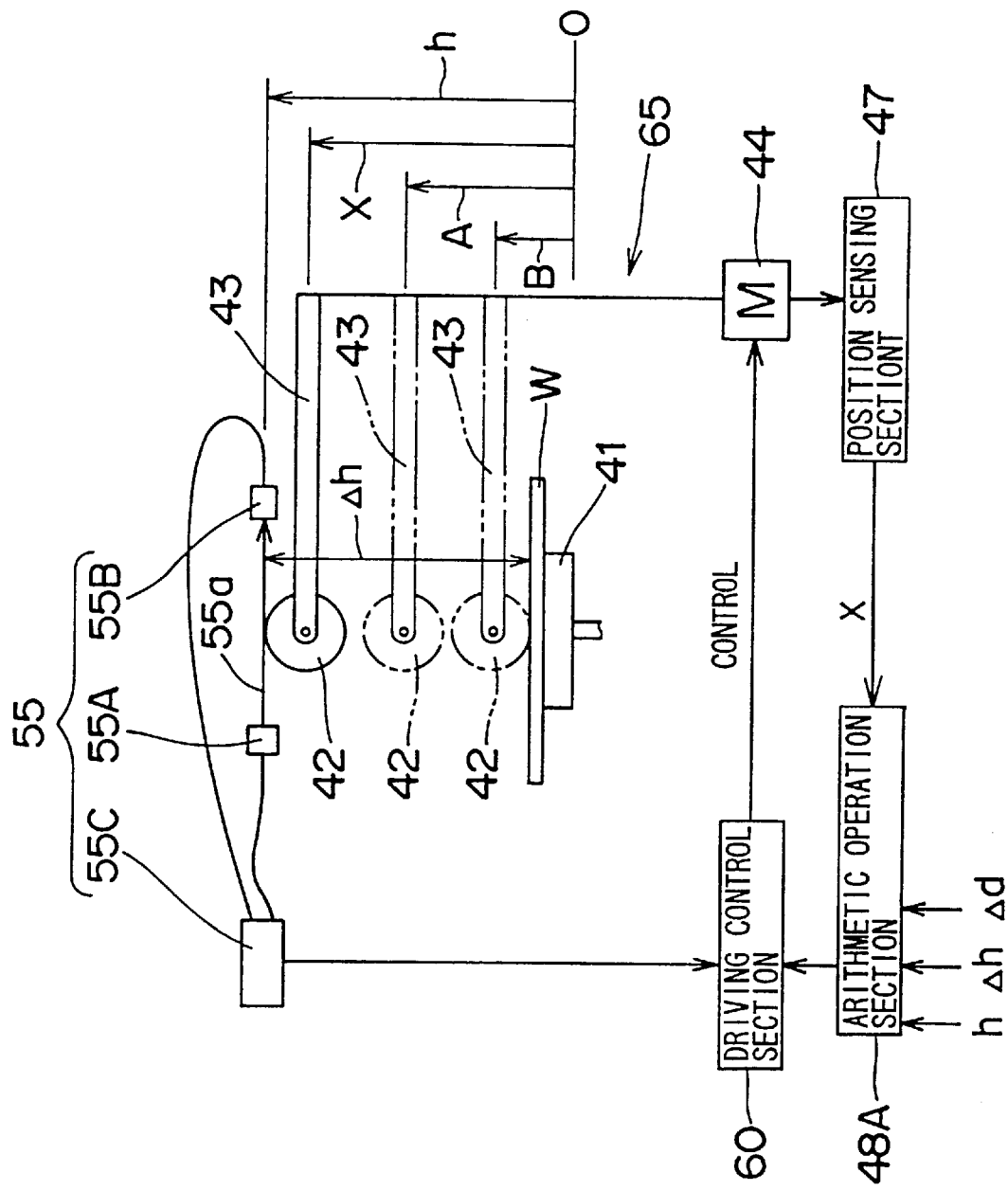
FIG. 4 is a diagram illustrating the basic construction of a wafer cleaning apparatus according to a third embodiment of the present invention.
Figure 5:
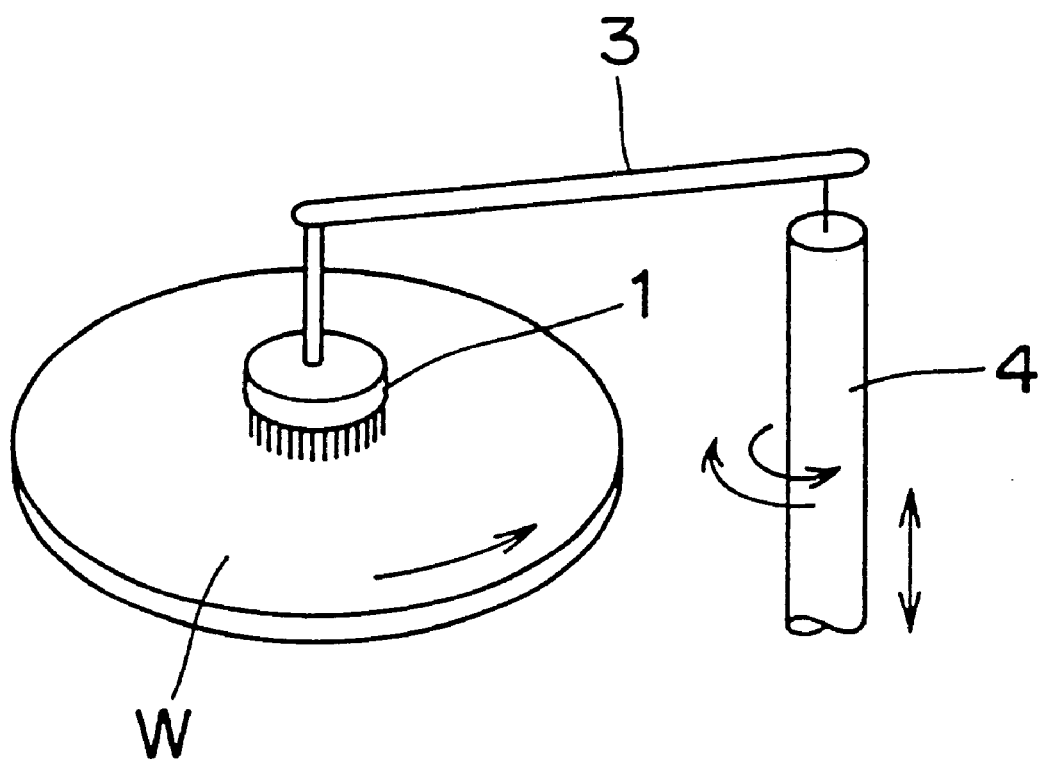
FIG. 5 is a schematic perspective view illustrating the construction of a wafer cleaning apparatus utilizing a disk brush.

FIG. 4 is a diagram illustrating the basic construction of a wafer cleaning apparatus in accordance with a third embodiment of the present invention. In FIG. 4, like components corresponding to the respective components shown in FIG. 3 are denoted by like reference numerals. A major difference from the second embodiment is that an optical sensor 55 (top portion detector of state sensing device) is employed instead of the pressure sensor in the second embodiment. More specifically, the optical sensor 55 includes paired light emitting portion 55A and light receiving portion 55B defining a detection line 55a horizontally extending above the roll brush 42, and a detection circuit 55C for outputting a detection signal. The detection circuit 55C outputs the detection signal if a light blocking object is present on the detection line 55a.

In this embodiment, the sink amount (i.e., depression amount) of the support member 43 after a portion of the circumference of the roll brush 42 has come in contact with the wafer W is adjusted to a predetermined reference depression amount Δd instead of adjusting the pushing pressure to the reference pressure P for the wafer scrubbing process by the roll brush 42. Thus, the scrubbing process is performed with the roll brush 42 pressed against the top surface of the wafer W with a constant pressure.

More specifically, an arithmetic operation section 48A to which an output of the position sensing section 47 is applied receives a height h of the detection line 55a with respect to the reference position 0, a height difference Δh between the detection line 55a and the top surface of a wafer W held on the chuck 41, and the reference depression amount Δd. The arithmetic operation section 48A calculates a value b from the following equation on the basis of the height x of the support member 43 sensed by the position sensing section 47. And the arithmetic operation section outputs the value b.

$$b = 2h - \Delta h - \Delta d - x$$

The driving control section 60 moves up the support member 43 from the stand-by position when the scrubbing process is not performed. Thus, a detection signal is output from the detection circuit 55C when the top portion of the roll brush 42 reaches the detection line 55a. In response to the detection signal, the driving control section 60 takes in the output of the arithmetic operation section 48A, and employs the value of the output of the arithmetic operation section 48A as a new height B of the support member in the processing position. More specifically, the following equation (2) is established.

$$B = 2h - \Delta h - \Delta d - X \tag{2}$$

wherein X is the height of the support member 43 obtained when the top portion of the roll brush 42 reaches the detection line 55a.

In the scrubbing process, the driving control section 60 controls the driving of the elevation motor 44 so that the vertical position of the support member 43 equals the height B determined in the aforesaid manner. At this time, the depression amount is Δd, which is proved in the following manner.

It is apparent from FIG. 4 that the following equation is true.

$$\Delta h + \Delta d = r + (X - B) + r = 2h - X - B$$

The equation (2) can be obtained by solving the above equation for B.

The same effects as in the first and second embodiments are thus ensured in this embodiment.

Although the present invention has been described by way of the foregoing three embodiments, the invention may be embodied in a different manner. For example, a PVA (polyvinyl alcohol) sponge or a fiber brush such as a nylon brush or a mohair brush may be used as the disk brush 15 in the first embodiment.

The foregoing embodiments are directed to the cleaning of a wafer, but the present invention can widely be applied to the cleaning of any of various substrates such as liquid crystal display glass substrates.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims priority benefits under 35 USC section 119 based on Japanese Patent Application No. 8-285375 filed on Oct. 28, 1996, the entire disclosure thereof being incorporated herein by reference.

What is claimed is:

1. A substrate processing apparatus, comprising:
   a substrate holding mechanism for generally horizontally holding a substrate;
   a scrubbing member for scrubbing a substrate held by the substrate holding mechanism;
   a retention member for retaining the scrubbing member;
   a vertical drive mechanism for vertically moving the retention member;
   a state sensing device for sensing a state of the scrubbing member said state sensing device includes a pressure sensing device for sensing a pushing pressure of the scrubbing member on a pressure sensing face;
   a position sensing device for sensing a vertical position of the retention member; and
   a vertical drive control section for determining a vertical position of the retention member for the scrubbing of the substrate by performing an arithmetic operation on the basis of the state sensed by the state sensing device and the position sensed by the position sensing device, and controlling the vertical drive mechanism, the vertical drive control section controls the vertical drive mechanism so that the pushing pressure of the scrubbing member equals a predetermined reference pressure.

2. A substrate processing apparatus as set forth in claim 1, wherein
   the retention member includes a pivot arm pivotal about a vertical axis,
   the scrubbing member includes a disk brush attached to the pivot arm with a face thereof downward, the disk brush being rotatable around a vertical axis, and
   the pressure sensing device has a pressure sensing face, against which the disk brush is pressed in a position defined at a predetermined height apart from the substrate held by the substrate holding mechanism.

3. A substrate processing apparatus as set forth in claim 1, wherein
   the scrubbing member is a roll brush rotatable around a horizontal axis, and
   the pressure sensing device has a pressure sensing face, against which the roll brush is pressed in a position of a predetermined height which is higher than a processing position where the roll brush comes in contact with the substrate held by the substrate holding mechanism.

4. A substrate processing apparatus as set forth in claim 1, wherein
   the pressure sensing device further includes an averaging circuit for calculating as the pushing pressure of the scrubbing member an average of pressure levels sensed by the pressure sensing device within a predetermined period during which the scrubbing member is actuated in a state where the scrubbing member is pressed against the pressure sensing face.

5. A substrate processing apparatus as set forth in claim 1, further comprising a cleaning liquid supplying device for supplying a cleaning liquid to the scrubbing member when the scrubbing member is located adjacent to the pressure sensing device.

6. A substrate processing apparatus, comprising:
   a substrate holding mechanism for generally horizontally holding a substrate;
   a scrubbing member for scrubbing a substrate held by the substrate holding mechanism, said scrubbing member being a roll brush rotatable around a horizontal axis;
   a retention member for retaining the scrubbing member;
   a vertical drive mechanism for vertically moving the retention member;
   a state sensing device for sensing a state of the scrubbing member, said state sensing device includes a top portion detector for detecting a top portion of the roll brush in a position of a predetermined height which is higher than a processing position where the roll brush comes in contact with the substrate held by the substrate holding mechanism;
   a position sensing device for sensing a vertical position of the retention member; and
   a vertical drive control section for determining a vertical position of the retention member for the scrubbing of the substrate by performing an arithmetic operation on the basis for the state sensed by the state sensing device and the position sensed by the position sensing device, and controlling the vertical drive mechanism.

* * * * *